US008942773B2

(12) United States Patent
Wu (10) Patent No.: US 8,942,773 B2
(45) Date of Patent: Jan. 27, 2015

(54) PROTECTION CASE FOR ELECTRONIC DEVICE

(75) Inventor: Hong-Ming Wu, New Taipei (TW)

(73) Assignee: Jenn Yaw J. Y. Enterprises Co., Ltd., New Taipei (TW)

( * ) Notice: Subject to any disclaimer, the term of this patent is extended or adjusted under 35 U.S.C. 154(b) by 865 days.

(21) Appl. No.: 13/179,958

(22) Filed: Jul. 11, 2011

(65) Prior Publication Data

US 2013/0015081 A1    Jan. 17, 2013

(51) Int. Cl.
*H05K 5/00* (2006.01)
*A45C 11/00* (2006.01)
*H04B 1/38* (2006.01)
*H05K 5/02* (2006.01)

(52) U.S. Cl.
CPC .............. *A45C 11/00* (2013.01); *H04B 1/3888* (2013.01); *H05K 5/0217* (2013.01); *H05K 5/00* (2013.01); *A45C 2011/002* (2013.01); *A45C 2200/15* (2013.01)
USPC ........ 455/575.8; 206/775; 206/461; 206/470; 206/472; 206/320; 220/845; 220/847; 220/4.22; 455/575.1; 455/572; 361/679.56; 361/679.01; 361/679.02; 379/428.01; 379/451

(58) Field of Classification Search
CPC ..... H05K 5/0095; H05K 5/00; H05K 5/0217; H05K 5/061; H04B 1/3888; H04M 1/0279; A45C 11/00; A45C 11/38
USPC ......... 206/320, 775, 776, 470, 471, 472, 474; 220/254.1, 254.3, 847, 845, 843, 4.23, 220/4.22, 4.24; 455/575.8, 566, 573, 574; 361/679.56, 679.58, 679.02; 379/454, 379/428.01, 455; 150/165; 248/676
See application file for complete search history.

(56) References Cited

U.S. PATENT DOCUMENTS

| | | | | |
|---|---|---|---|---|
| 3,878,964 | A * | 4/1975 | Fogle ............................ | 220/756 |
| 4,452,373 | A * | 6/1984 | Pearce et al. ................. | 220/4.22 |
| D274,889 | S * | 7/1984 | Sullivan ........................ | D9/426 |
| 7,099,149 | B2 * | 8/2006 | Krieger et al. ............. | 361/679.3 |
| 7,099,710 | B1 * | 8/2006 | Faillance .................... | 455/575.8 |
| 7,206,618 | B2 * | 4/2007 | Latto et al. .................. | 455/575.8 |
| 8,110,268 | B2 * | 2/2012 | Hegemier et al. ........... | 428/40.1 |
| 8,262,053 | B1 * | 9/2012 | Zhao ............................ | 248/676 |
| 8,328,153 | B2 * | 12/2012 | Yang et al. ................... | 248/370 |
| D673,937 | S * | 1/2013 | Cheng et al. ................ | D14/250 |
| D684,362 | S * | 6/2013 | Robbins et al. .............. | D3/269 |
| 8,504,126 | B1 * | 8/2013 | Maravilla et al. .......... | 455/575.1 |
| D691,144 | S * | 10/2013 | Peters et al. ................ | D14/440 |
| 8,605,431 | B2 * | 12/2013 | Cheng et al. ............. | 361/679.56 |
| 8,616,373 | B2 * | 12/2013 | Hansen et al. ................ | 206/463 |

(Continued)

*Primary Examiner* — Mickey Yu
*Assistant Examiner* — Gideon Weinerth
(74) *Attorney, Agent, or Firm* — C. G. Mersereau; Nikolai & Mersereau, P.A.

(57) ABSTRACT

A protection case for a portable electronic device includes a case having a front part and a rear part, and the portable electronic device is accommodated between the front and rear parts. A rear cover is connected to the rear part and a front cover is connected to the front part. The front cover has a front decoration plate, a connection member and a locking member. The front decoration plate is removably connected to the front part. The connection member is flexible and has a first end connected to the front decoration plate and a second end of the connection member is clamped between the front and rear parts. The locking member has a hook hooked with the groove. The protection case can be easily replaced and changed.

10 Claims, 12 Drawing Sheets

(56) References Cited

U.S. PATENT DOCUMENTS

| | | | |
|---|---|---|---|
| 8,646,610 B2* | 2/2014 | Foght | 206/576 |
| 2001/0035444 A1* | 11/2001 | Alis | 224/250 |
| 2005/0130721 A1* | 6/2005 | Gartrell | 455/575.8 |
| 2007/0161420 A1* | 7/2007 | Hsu | 455/575.8 |
| 2008/0053770 A1* | 3/2008 | Tynyk | 190/100 |
| 2008/0053851 A1* | 3/2008 | Ko et al. | 206/320 |
| 2008/0096620 A1* | 4/2008 | Lee et al. | 455/575.8 |
| 2008/0251512 A1* | 10/2008 | Griffin et al. | 220/4.02 |
| 2008/0268916 A1* | 10/2008 | Lin et al. | 455/573 |
| 2009/0015192 A1* | 1/2009 | Sheu | 320/103 |
| 2009/0017883 A1* | 1/2009 | Lin | 455/575.8 |
| 2009/0080153 A1* | 3/2009 | Richardson et al. | 361/679.56 |
| 2009/0114556 A1* | 5/2009 | Tai et al. | 206/320 |
| 2009/0255092 A1* | 10/2009 | Huang et al. | 16/405 |
| 2009/0314400 A1* | 12/2009 | Liu | 150/165 |
| 2009/0314915 A1* | 12/2009 | Tu et al. | 248/398 |
| 2010/0048268 A1* | 2/2010 | O'Neill et al. | 455/575.8 |
| 2010/0116387 A1* | 5/2010 | Channey et al. | 150/165 |
| 2010/0258463 A1* | 10/2010 | Yang et al. | 206/320 |
| 2010/0270189 A1* | 10/2010 | Pedersen et al. | 206/320 |
| 2010/0317413 A1* | 12/2010 | Tan | 455/573 |
| 2011/0077061 A1* | 3/2011 | Danze et al. | 455/575.1 |
| 2011/0192510 A1* | 8/2011 | Bau | 150/154 |
| 2012/0103844 A1* | 5/2012 | Piedra et al. | 206/320 |
| 2012/0162102 A1* | 6/2012 | Cheng et al. | 345/173 |
| 2012/0178507 A1* | 7/2012 | Lee | 455/575.1 |
| 2012/0241330 A1* | 9/2012 | Still | 206/45.24 |
| 2013/0273983 A1* | 10/2013 | Hsu | 455/575.1 |
| 2013/0292281 A1* | 11/2013 | Chung | 206/320 |
| 2013/0313150 A1* | 11/2013 | Grinwald | 206/462 |
| 2013/0335891 A1* | 12/2013 | Chen et al. | 361/679.01 |
| 2013/0341222 A1* | 12/2013 | Lin | 206/320 |
| 2014/0024419 A1* | 1/2014 | Norris et al. | 455/575.8 |
| 2014/0051488 A1* | 2/2014 | Chung | 455/575.8 |
| 2014/0076753 A1* | 3/2014 | Limber et al. | 206/320 |
| 2014/0083876 A1* | 3/2014 | Lin | 206/37 |
| 2014/0094227 A1* | 4/2014 | Hu et al. | 455/566 |
| 2014/0116897 A1* | 5/2014 | Wilkey | 206/37 |
| 2014/0192481 A1* | 7/2014 | Wojcik et al. | 361/679.55 |
| 2014/0200056 A1* | 7/2014 | Liu | 455/575.8 |
| 2014/0224685 A1* | 8/2014 | Carnevali | 206/320 |

* cited by examiner

PROTECTION CASE FOR ELECTRONIC DEVICE

BACKGROUND OF THE INVENTION (1) Field of the Invention

The present invention relates to a protection case, and more particularly, to a protection case for an electronic device and the protection case is easily replaced and changed.

(2) Description of the Prior Art

The electronic devices are developed rapidly and the portable electronic devices are welcomed by the users, such as cellular phones, iPads, iPhones, PDAs, laptops, and MP3 players. These electronic devices are portable and easily put in bags or pockets. However, the case of the electronic devices are made by plastic and coated with multiple layers of paints which are easily scraped by impact with other objects in the bags and pockets. Besides, when the portable electronic devices drop on the ground, the plastic-made case and the paints can easily be damaged. Therefore, there are many protection cases are developed and the portable electronic device is received in the protection case to prevent the situations mentioned above.

The conventional protection cases have fixed patterns and shapes which are limited due to the cost so that the users can easily find that other users have the same protection case as theirs. If the protection cases are frequently replaced, it requires significant amount of money.

The present invention intends to provide a protection case for a portable electronic device and the protection case is easily manufacturing at low cost the can be easily replaced and changed.

SUMMARY OF THE INVENTION

The present invention relates to a protection case for a portable electronic device and comprises a case having a front part and a rear part, and the portable electronic device is accommodated between the front and rear parts. The front part has two recesses in opposite ends of a front side thereof and a groove is defined in the rear side of the front part. A ridge extends from the inside of the rear part. A rear cover is connected to the rear part and engaged with the ridge. A front cover has a front decoration plate, a connection member and a locking member. The front decoration plate is connected to the front part and has two extension plates respectively extending from two sides thereof and engaged with the two recesses. The connection member is flexible and has a first end connected to one of the two extension plates of the front decoration plate, and a second end of the connection member is clamped between the front and rear parts. The locking member has a hook hooked with the groove.

The front and rear covers can be separated from the case and easily replaced with new ones with different colors or patterns. The front and rear covers are easily manufactured at low cost so that the users can have their custom-made front and rear covers.

The primary object of the present invention is to provide a protection case for a portable electronic device, wherein the protection case is easily replaced and changed by.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENTS

Figure 1:
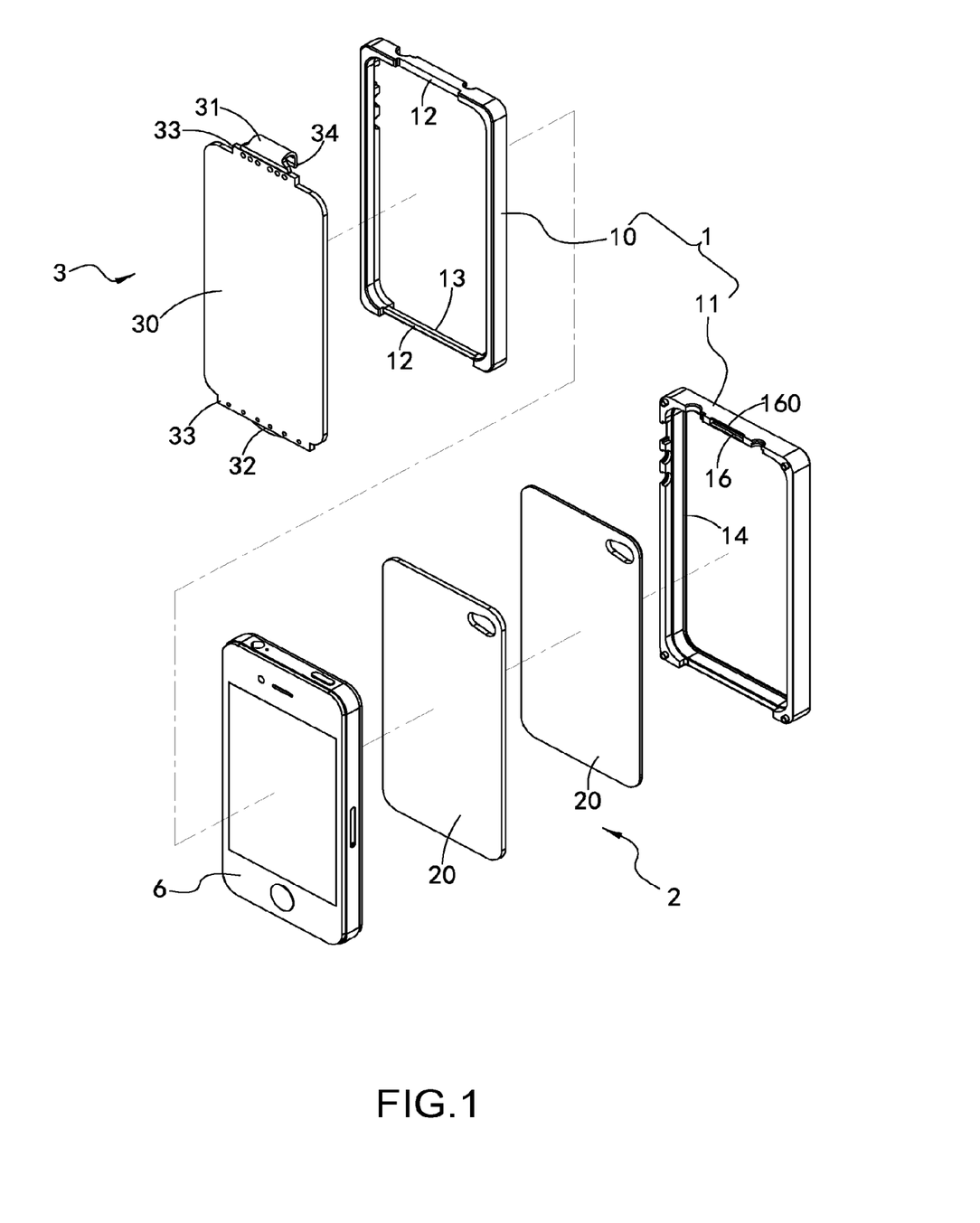
FIG. 1 is an exploded view to show the first embodiment of the protection case of the present invention.
Figure 2:
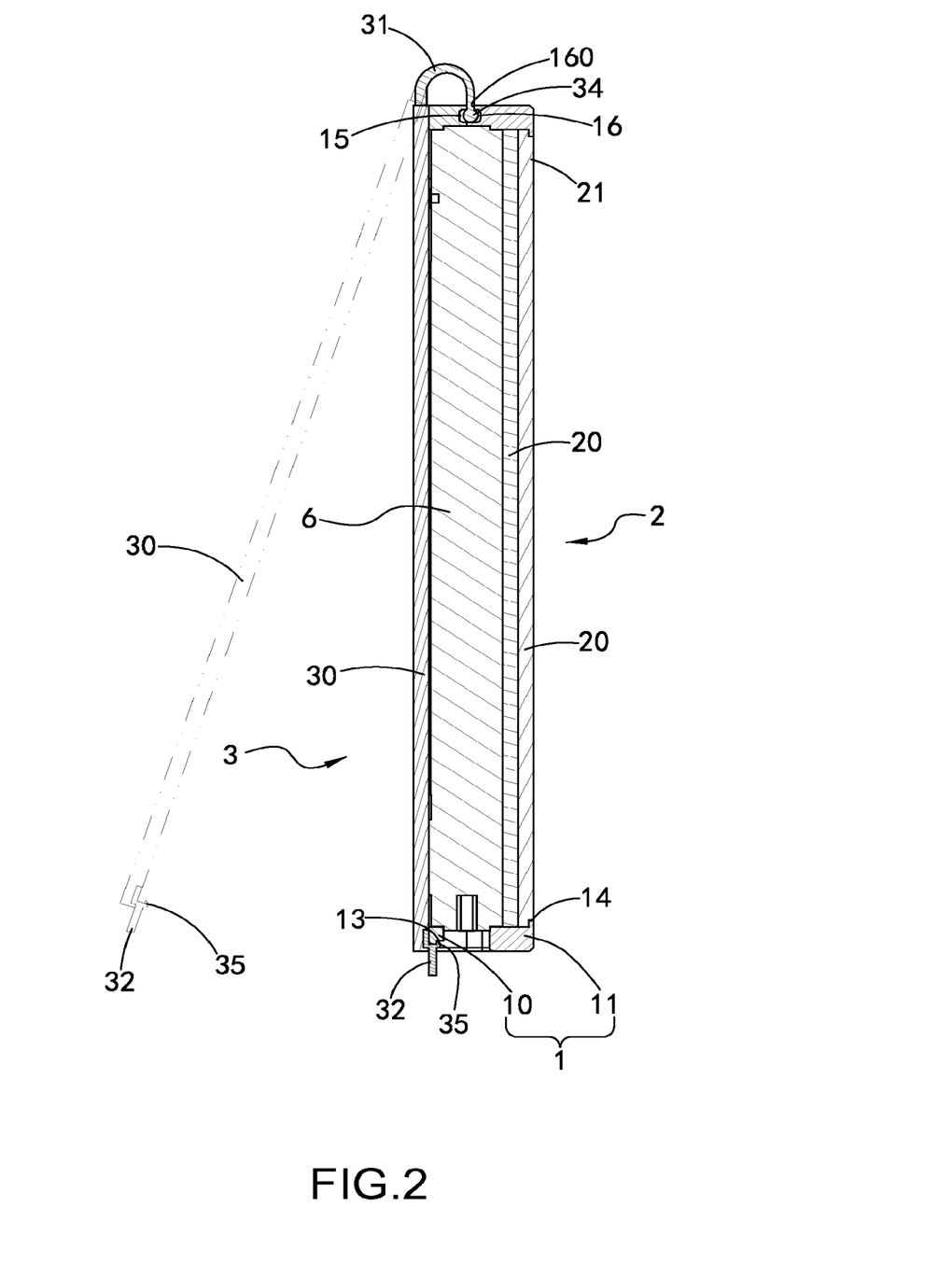
FIG. 2 is a cross sectional view of the first embodiment of the protection case of the present invention.
Figure 3:
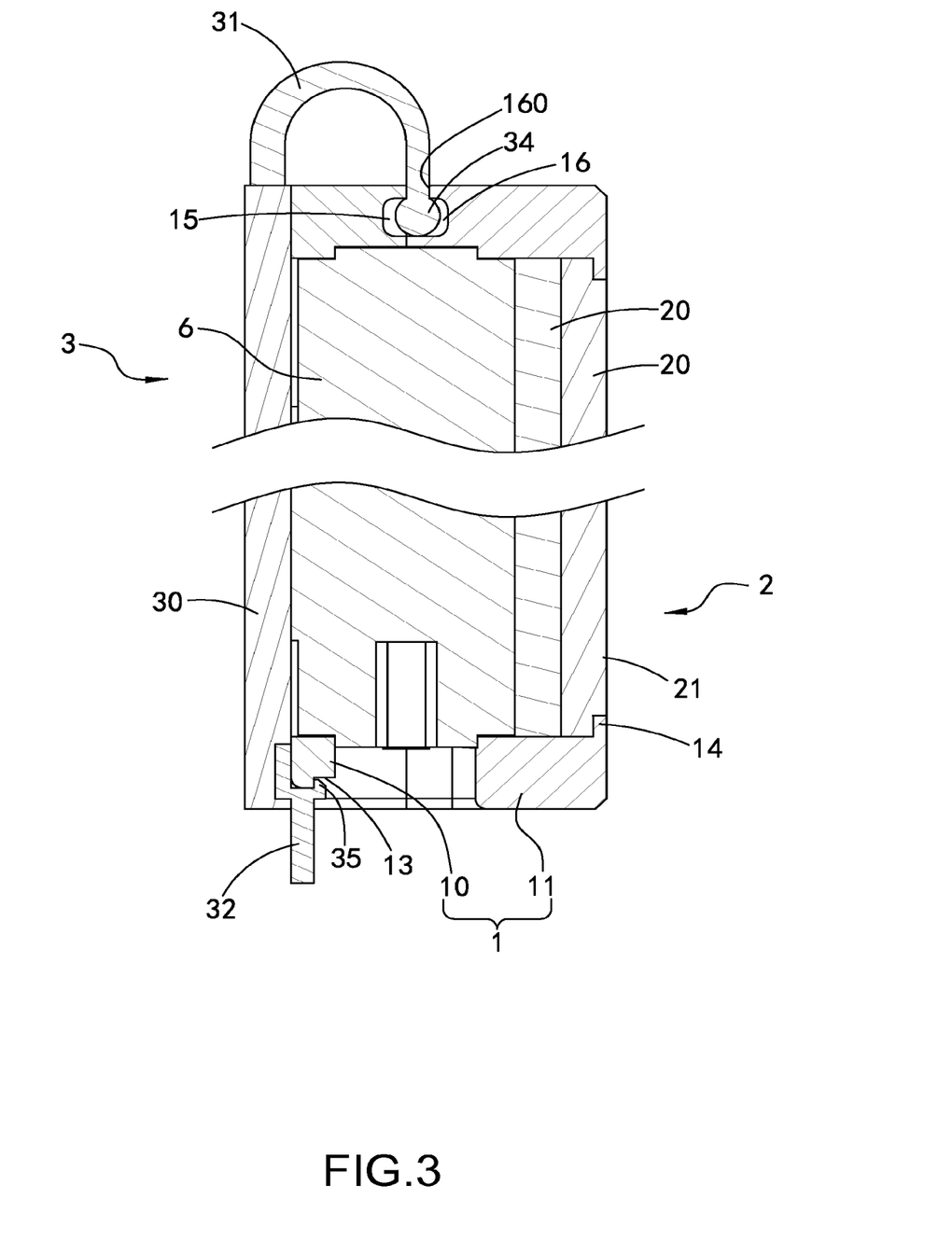
FIG. 3 is an enlarged cross sectional view to show a portion of the first embodiment of the protection case of the present invention.

Referring to FIGS. 1 to 3, the protection case for a portable electronic device comprises a case 1, a rear cover 2 and a front cover 3.

The case 1 comprises a front part 10 and a rear part 11 which is connected to the front part 10, and the case 1 accommodates the portable electronic device 6 therein. The front part 10 has two recesses 12 defined in opposite ends of a front side thereof, and a groove 13 is defined in a rear side of the front part 10 and located corresponding to one of the recesses 12. A ridge 14 extends from the inside of the rear part 11. The front part 10 has a front engaging slot 15 defined in the rear side thereof. The rear part 11 has a rear engaging slot 16 and a rear hole 160 at a front side thereof. The rear hole 160 is smaller than the rear engaging slot 16. The rear hole 160 communicates with a side of the rear part 11. The front and rear engaging slots 15, 16 define a connection slot.

The rear cover 2 is connected to the rear part 11 and engaged with the inside of the ridge 14. The rear cover 2 covers the rear side of the portable electronic device 6 and has two rear decoration plates 20. The rear cover 2 has a protrusion part 21 extending from its rear side and is in flush with the rear side of the rear part 11. The two rear decoration plates 20 have different colors or at least one of the two rear decoration plates 20 has different patterns which can be made by way of printing, painting, exterior laser engraving or interior laser engraving. The rear cover 2 is a solar energy panel which is provides power to the portable electronic device 6.

The front cover 3 has a front decoration plate 30, a connection member 31 and a locking member 32. The front decoration plate 30 is connected to the front part 10 to cover the front side of the portable electronic device 6, and has two extension plates 33 respectively extending from two sides thereof and engaged with the two recesses 12, so that the front decoration plate 30 is in flush with the front side of the front part 10. The front decoration plate 30 can be transparent or has colors, or has at least one pattern which can be made by way of printing, painting, exterior laser engraving or interior laser engraving. The connection member 31 is flexible and has a first end connected to the extension plate 33 on top of the front decoration plate 30, and a second end of the connection member 31 has an enlarged protrusion portion 34. The connection member 31 extends through the rear hole 160 and the enlarged protrusion portion 34 is clamped in the connection slot defined by the front and rear engaging slots 15, 16. The locking member 32 is connected to the other extension plate 33 on the front decoration plate 30. The locking member 32 has a hook 35 which is hooked with the groove 13.

As shown in FIGS. 2 and 3, the hook 35 of the locking member 32 is hooked with the groove 13 to hold the front decoration plate 30 to cover the front side of the portable electronic device 6. When operating the portable electronic device 6, the locking member 32 is shifted outward to disengage the hook 35 from the groove 13, so that the front decoration plate 30 is lifted upward by the deformation of the connection member 31, and the front side of the portable electronic device 6 is exposed.

The front and rear parts 10, 11 are easily separated from each other, and the two rear decoration plates 20 and the front decoration plate 30 can easily separated from the case 1. The rear decoration plate 20 and the front cover 3 can be replaced by different colors and patterns to have brand new look of the portable electronic device 6. The rear decoration plate 20 and the front cover 3 are easily manufactured at low cost so that the uses can change them without economic burdens.

Figure 4:
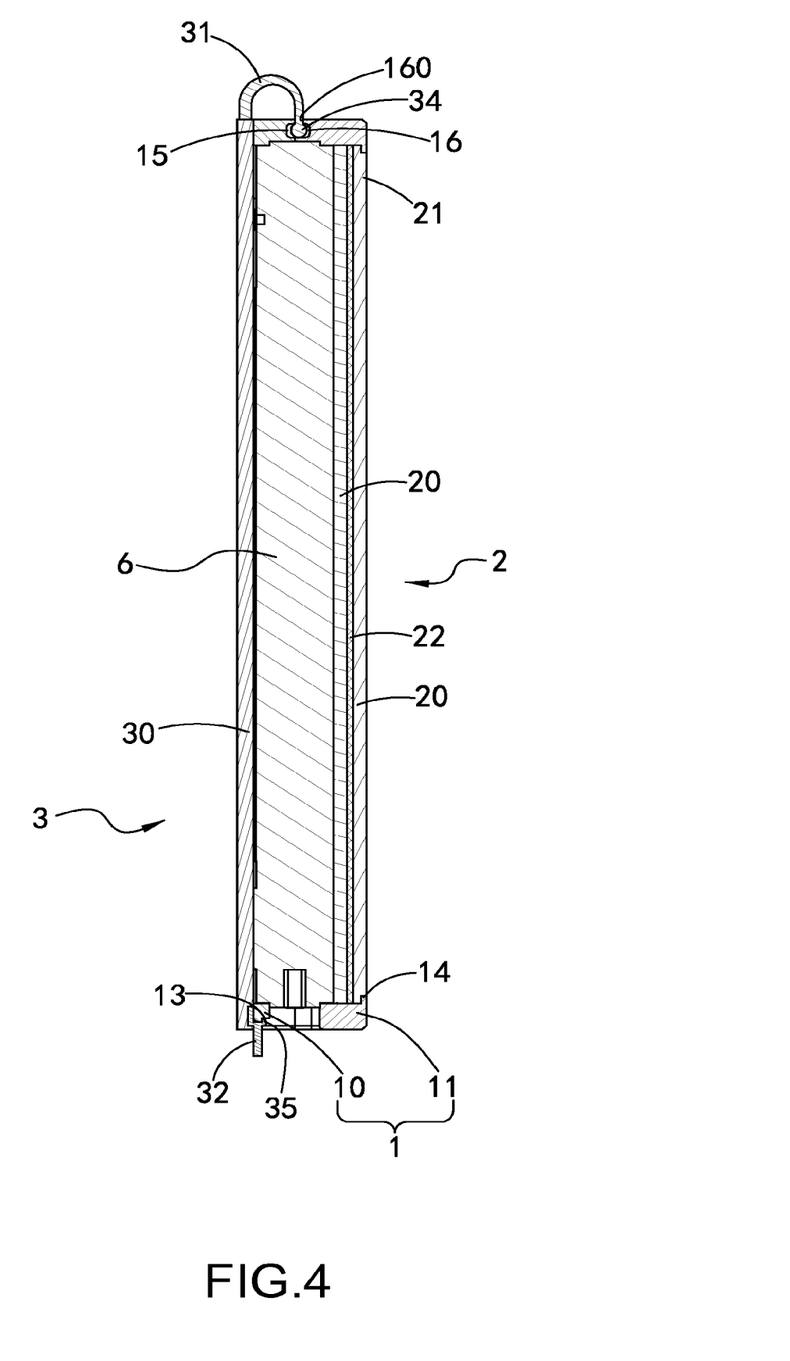
FIG. 4 is a cross sectional view of the second embodiment of the protection case of the present invention.

As shown in FIG. 4 which is the second embodiment of the present invention, wherein the difference from the first embodiment is that the rear decoration plate 20 located at the outside of the multiple rear decoration plate 20 is a transparent plate and a photo 22 is clamped between the transparent rear decoration plate 20 and the rear decoration plate 20 next to the transparent rear decoration plate 20.

Figure 5:
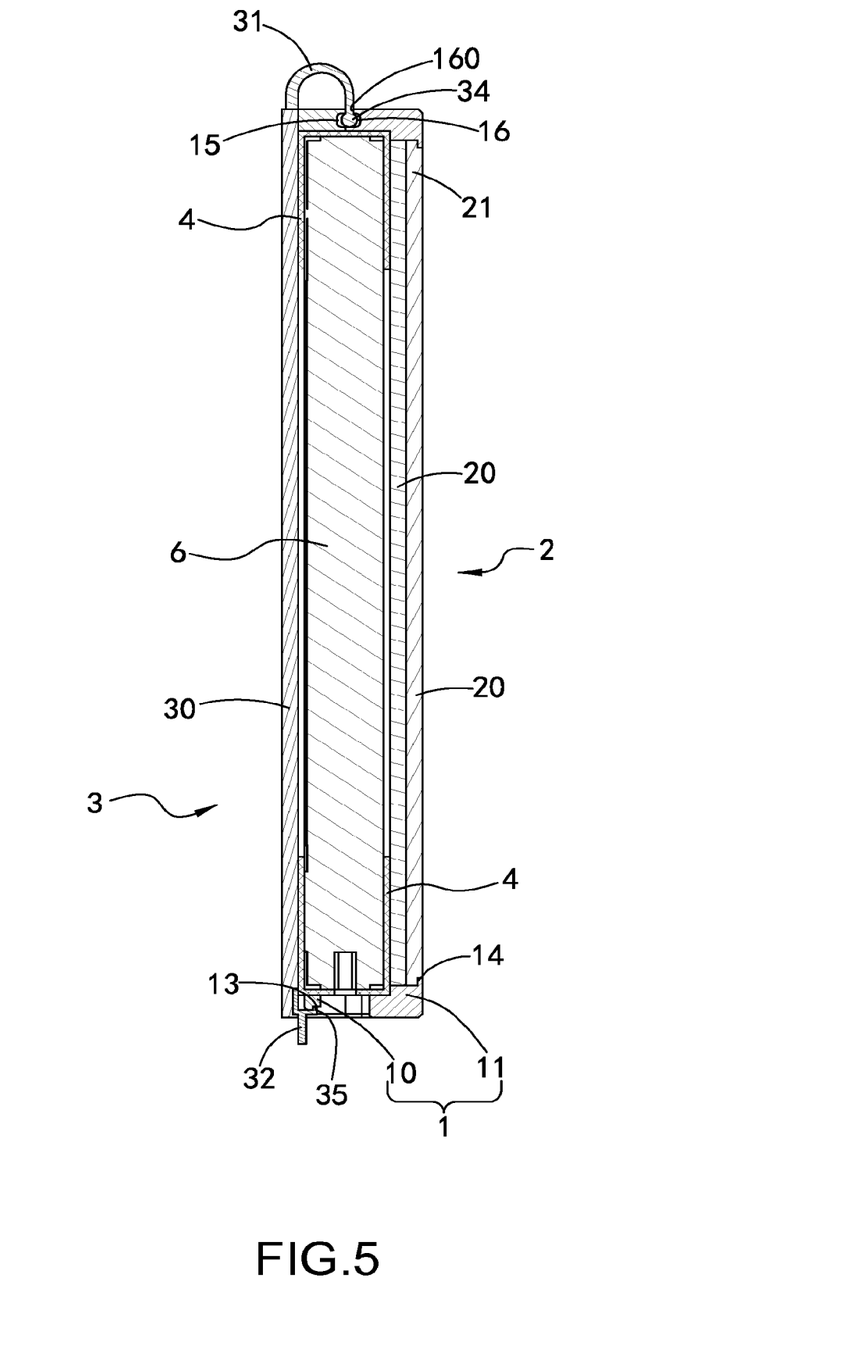
FIG. 5 is a cross sectional view of the third embodiment of the protection case of the present invention.

As shown in FIG. 5 which is the third embodiment of the present invention, wherein the difference from the first embodiment is that a rubber coat 4 is mounted to the outside of the portable electronic device 6 to isolate the rear decoration plate 20 from the case 1, so that the surface the rear decoration plate 20 is not scratched by the case 1. The rubber coat 4 also buffers impact to the portable electronic device 6 and provides water-proof feature to the portable electronic device 6.

As shown in FIGS. 6 to 9 which show the fourth embodiment of the present invention and which is similar to the first embodiment, wherein the difference from the first embodiment is that the protection case includes two slides 5.

Figure 6:
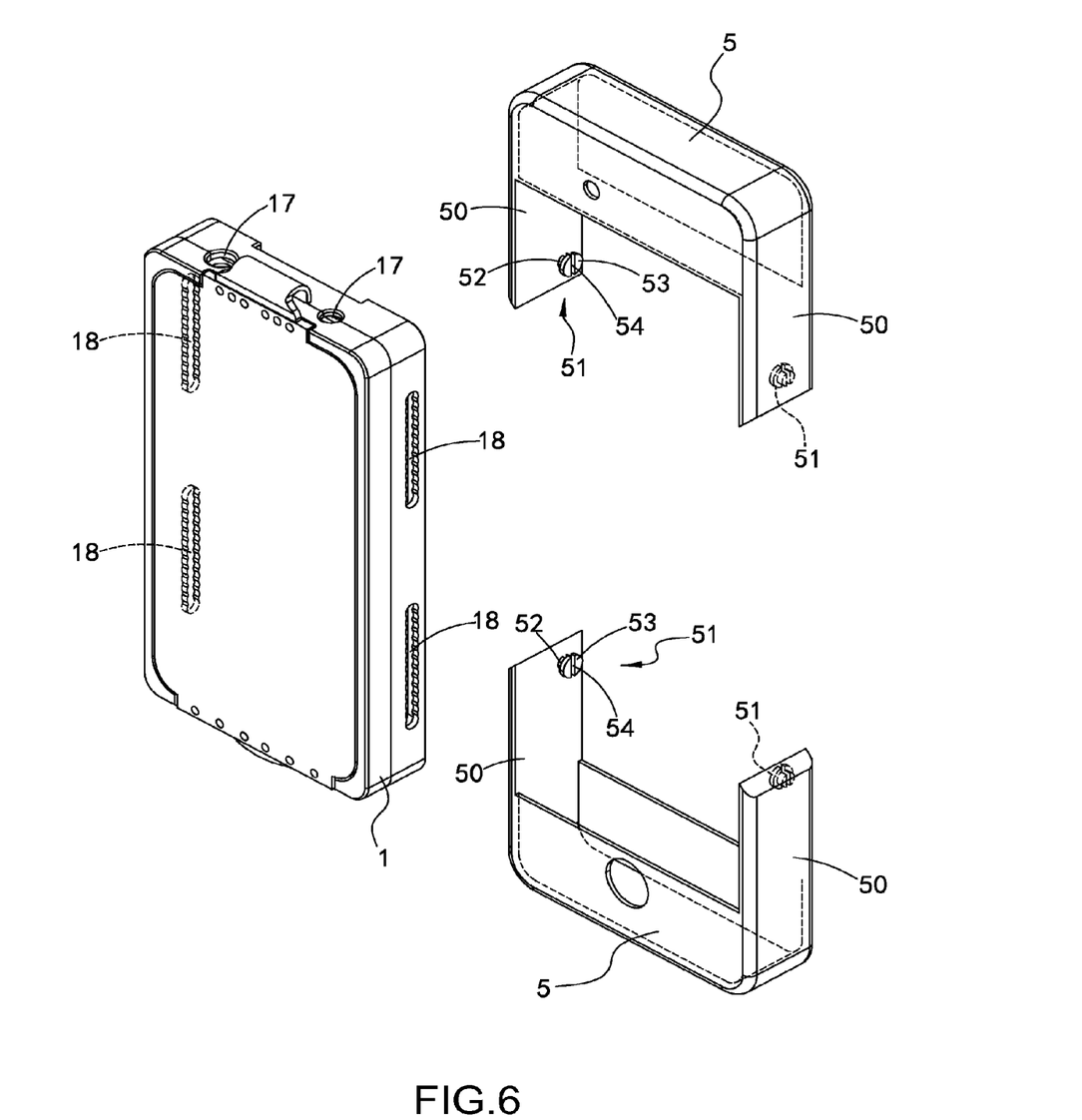
FIG. 6 is an exploded view to show the fourth embodiment of the protection case of the present invention.

Two ends of the case 1 include at least one through hole 17 which is located corresponding to connection ports 62 of the portable electronic device 6. Two sides of the case 1 each have two slide slots 18 and each slide slot 18 comprises a restriction slot 180 and a positioning slot 181 which is smaller than the restriction slot 180. The positioning slots 181 are located outside of the restriction slots 180. Two inside sides of each of the positioning slots 181 has positioning protrusions 182.

The two slides 5 are slidable and rotatable relative to the top and bottom ends of the case 1 so as to expose or cover the through holes 17. Each have two side plates 50 extending beyond the two sides of the case 1 and each side plate 50 has a resilient hook 51 which is slidably engaged with the slide slot 18 corresponding thereto. Each resilient hook 51 has a protrusion rod 52 on the side plate 50 and the protrusion rod 52 has an enlarged part 53 on a distal end thereof. The enlarged part 53 has at least one slit 54 defined from the enlarged part 53 to a root portion of the protrusion rod 52. The protrusion rod 52 is movable in the positioning slot 181 and the enlarged part 53 is movable in the restriction slot 180. The slit 54 provides a space for deformation of the positioning protrusion 182.

Figure 7:
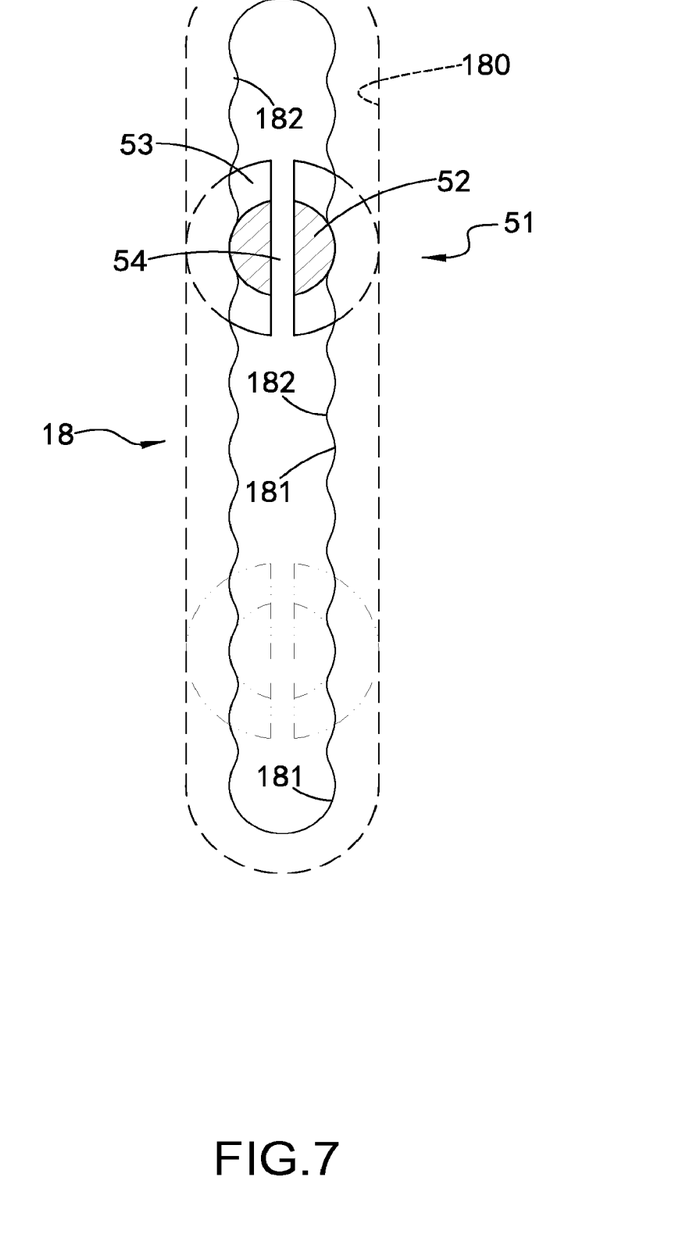
FIG. 7 shows that the engagement between the slide slots and the resilient hook of the fourth embodiment of the present invention.

As shown in FIG. 7, the protrusion rod 52 of the resilient hook 51 is movable and positioned in the positioning slot 181 via the slit 54.

Figure 8:
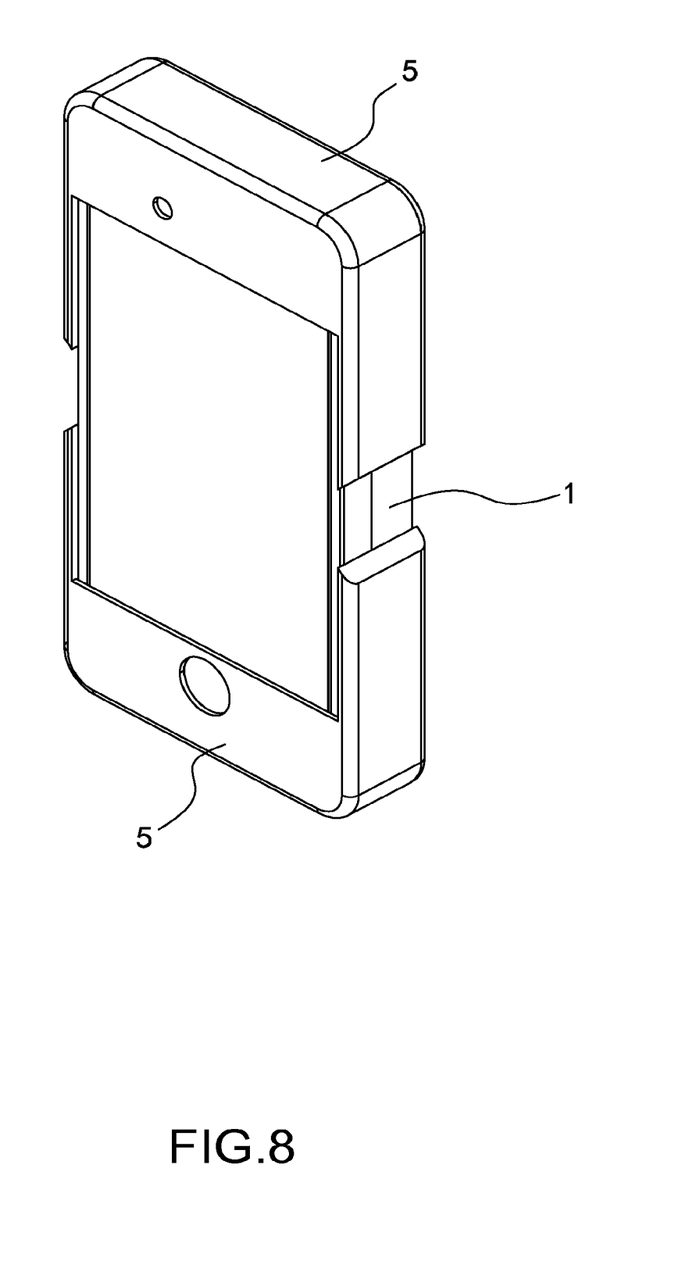
FIG. 8 shows the folded status of the fourth embodiment of the present invention.

As shown in FIGS. 6 and 8, the slides 5 cover the through holes 17 of the case 1 to prevent water from entering into the through holes 17.

Figure 9:
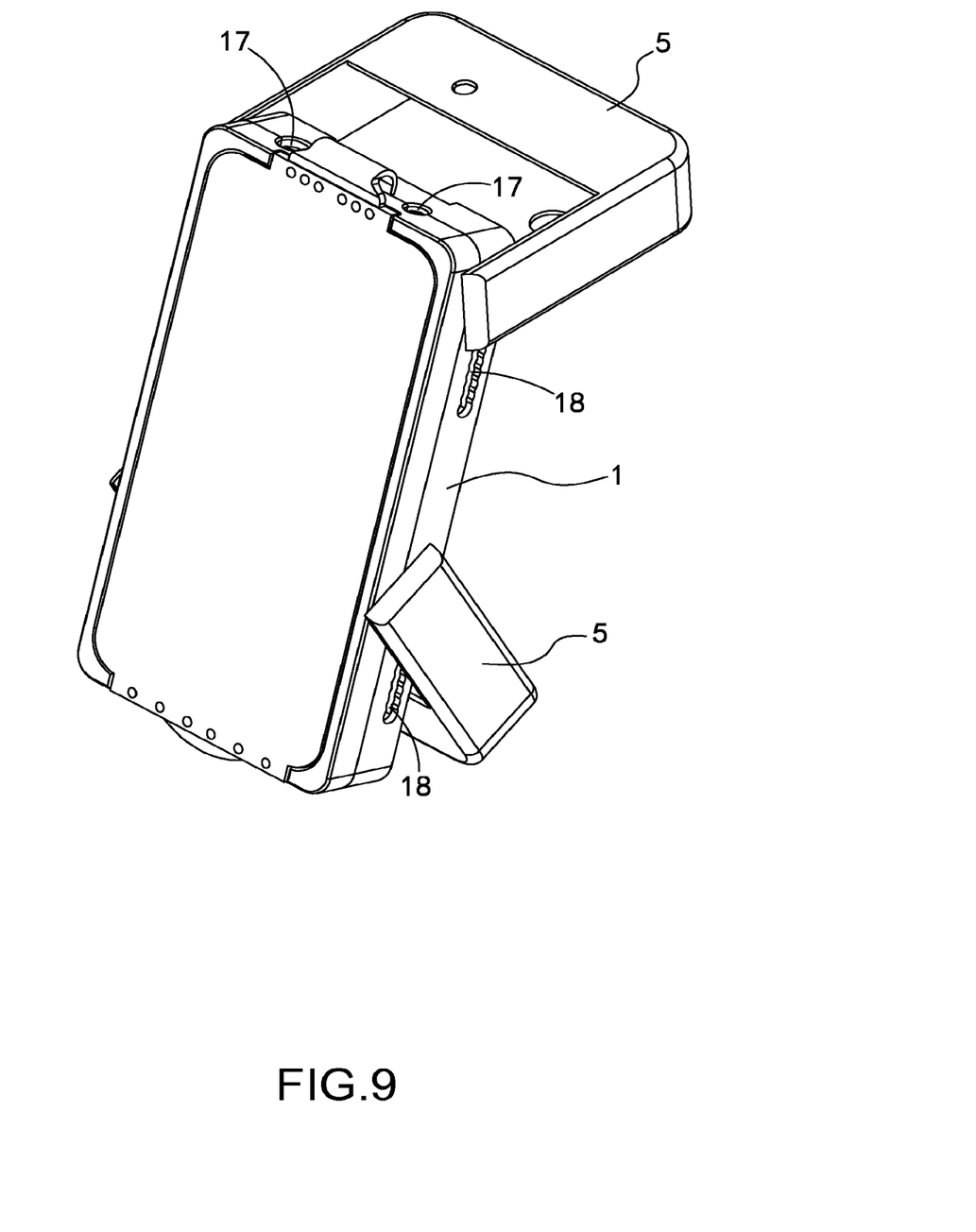
FIG. 9 shows the operation status of the fourth embodiment of the present invention.

As shown in FIG. 9 which shows that the through holes 17 are exposed when the slides 5 move outward and swing, so that the connection ports of the portable electronic device 6 can be used. The slides 5 and the case 1 are positioned at an angle relative to each other so that the portable electronic device 6 can be positioned at an angle on the table and is convenient for operation.

Figure 10:
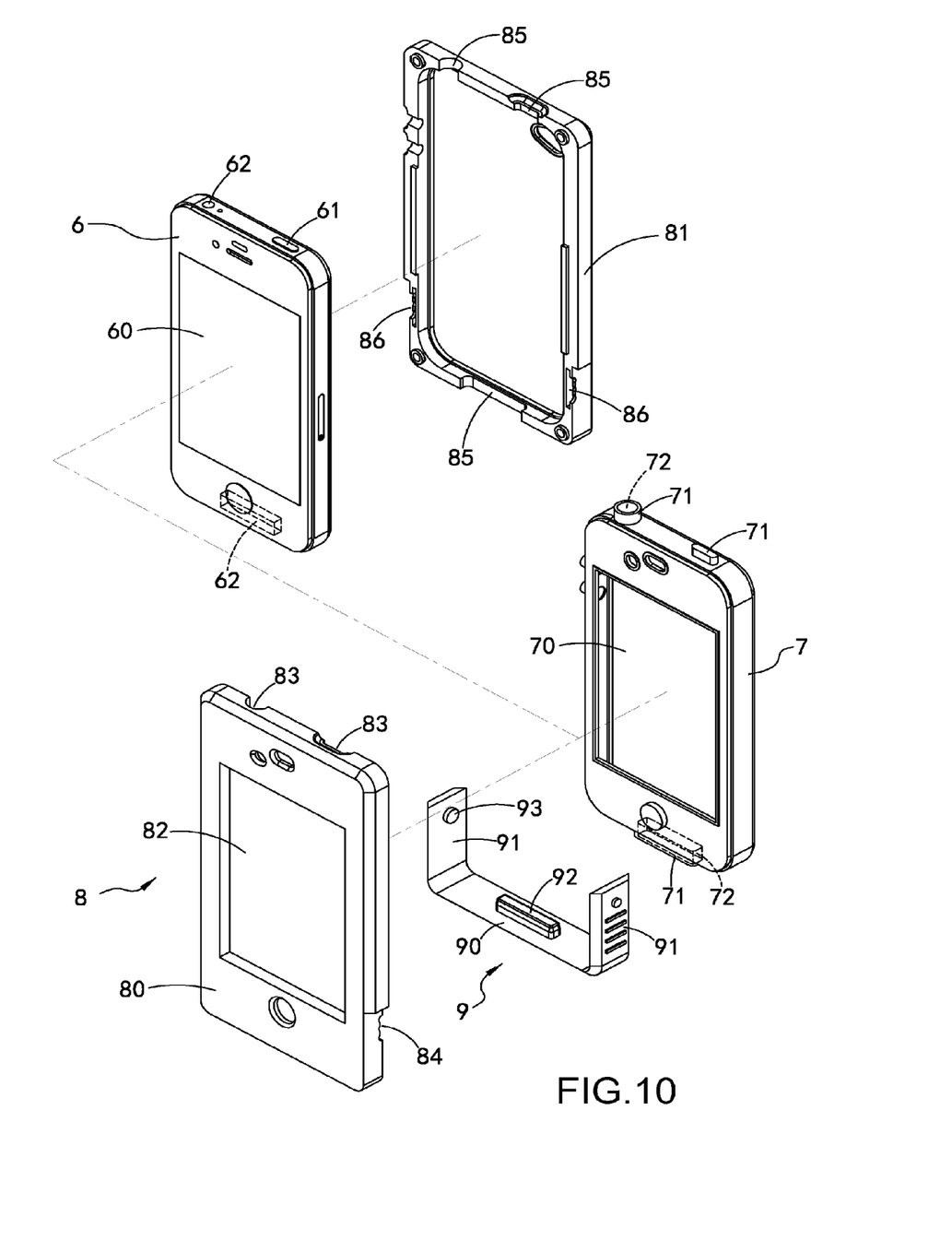
FIG. 10 is an exploded view to show the fifth embodiment of the protection case of the present invention.
Figure 11:
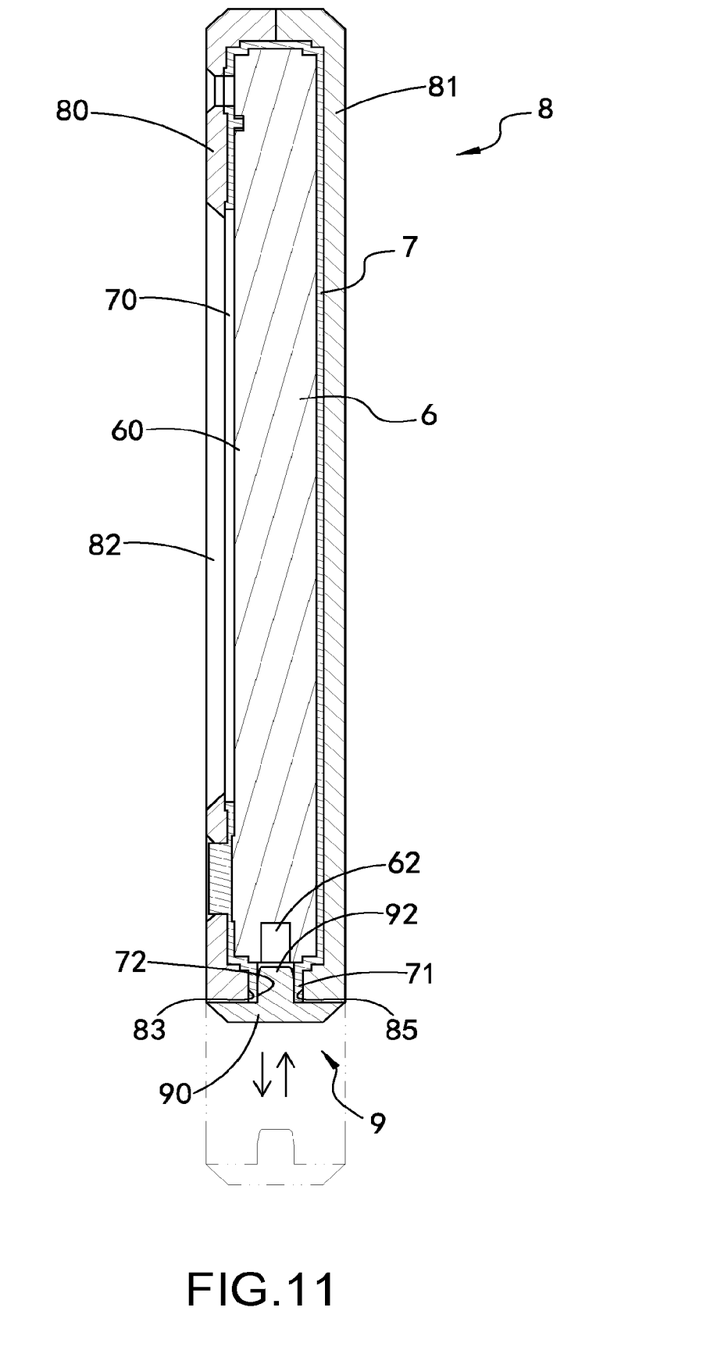
FIG. 11 is a cross sectional view of the fifth embodiment of the protection case of the present invention.
Figure 12:
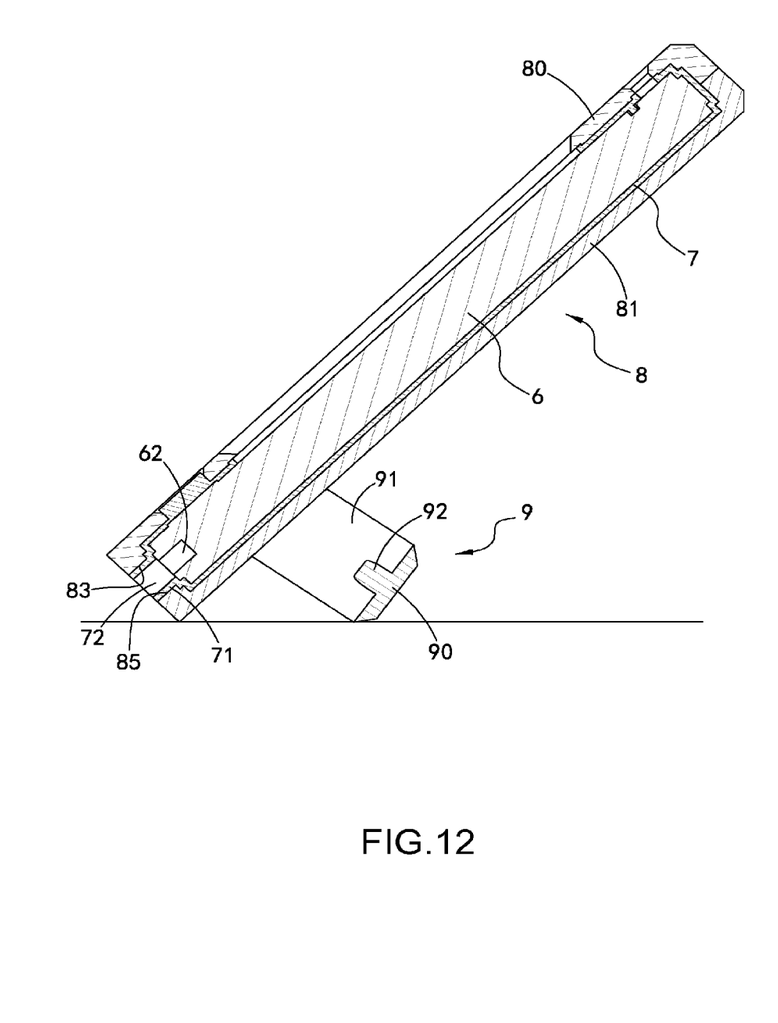
FIG. 12 is a cross sectional view to show the operation status of the fifth embodiment of the protection case of the present invention.

FIGS. 10 to 12 show the fifth embodiment of the present invention which comprises a resilient coat 7, an outer case 8 and a slide 9.

The resilient coat 7 is mounted to the portable electronic device 6 and has a through hole 70 which is located corresponding to a screen 60 of the portable electronic device 6. The resilient coat 7 has protrusions 71 which are located corresponding to buttons 61 and connection ports 62 of the portable electronic device 6. The protrusions 71 located corresponding to the connection ports 62 has an insertion hole 72 for receiving a cable (not shown) inserted therein;

The outer case 8 has a front part 80 and a rear part 81 which is connected to the front part 80. The resilient coat 7 clamped between the front and rear parts 80, 81. The front part 80 has a window 82 which is located corresponding to the through hole 70 of the resilient coat 7. The front part 80 has a front recess 83 which is located corresponding to the protrusion 71 of the resilient coat 7. The front part 80 has two front slide slots 84 respectively on two sides thereof. The rear part 81 has a rear recess 85 which is located corresponding to the protrusion 71 of the resilient coat 7. The front and rear recesses 83, 85 define an aperture and the protrusion 71 extends through the aperture. The rear part 81 has two rear slide slots 86 respectively on two sides thereof. The front and rear slide slots 84, 86 define a slide slot.

The slide 9 has a connection plate 90 and two side plates 91 extend from two sides of the connection plate 90. The connection plate 90 has an insertion 92 inserted in the insertion hole 72 below the protrusion 71. The two side plates 91 each have two engaging members 93 which are slidably engaged with the two front and slide slots 84, 86 of the outer case 8 so that the slide 9 is slidable and rotatable relative to the outer case 8.

As shown in FIG. 11, the insertion 92 of the slide 9 seals the insertion hole 72 of the resilient coat 7 to avoid water from entering from the insertion hole 72. When the connection ports 62 of the portable electronic device 6 are to be connected with exterior devices, the slide 9 is slid downward to remove the insertion 92 from the insertion hole 72, the exterior device can be connected to the connection port 62 via the insertion hole 72.

As shown in FIG. 12, the slides 9 and the outer case 8 are positioned at an angle relative to each other so that the portable electronic device 6 can be positioned at an angle on the table and is convenient for operation.

While we have shown and described the embodiment in accordance with the present invention, it should be clear to those skilled in the art that further embodiments may be made without departing from the scope of the present invention.

What is claimed is:

1. A protection case for a portable electronic device, comprising:
   a case having a front part and a rear part which is connected to the front part, the case adapted to accommodate the portable electronic device therein, the front part having two recesses defined in opposite ends of a front side thereof, a groove defined in a rear side of the front part and located corresponding to one of the recesses, a ridge extending from an inside of the rear part;
   a rear cover connected to the rear part and engaged with an inside of the ridge, the rear cover adapted to cover a rear side of the portable electronic device, and
   a front cover having a front decoration plate, a connection member and a locking member, the front decoration plate connected to the front part and having two extension plates respectively extending from two sides thereof and engaged with the two recesses, the front decoration plate adapted to cover a front side of the portable electronic device, the connection member being flexible and having a first end connected to one of the two extension plates of the front decoration plate, a second end of the connection member being clamped between the front and rear parts, the locking member connected to the other extension plate on the front decoration plate, the locking member having a hook which is hooked with the groove.

2. The protection case as claimed in claim 1, wherein the rear part has a rear engaging slot and a rear hole at a front side thereof, the rear hole is smaller than the rear engaging slot, the rear hole communicates with a side of the rear part, the front part has a front engaging slot defined in a rear side thereof, the front and rear engaging slots define a connection slot, the connection member has a first end extending through the rear hole and has an enlarged protrusion portion which is engaged with the connection slot.

3. The protection case as claimed in claim 1, wherein the front decoration plate has at least one pattern.

4. The protection case as claimed in claim 1, wherein the rear cover has multiple rear decoration plates.

5. The protection case as claimed in claim 4, wherein the rear decoration plate located at the outside of the multiple rear decoration plate is a transparent plate and a photo is clamped between the transparent rear decoration plate and the rear decoration plate next to the transparent rear decoration plate.

6. The protection case as claimed in claim 1, wherein the front decoration plate and the rear cover are solar energy panels which is adapted to provide power to the portable electronic device.

7. The protection case as claimed in claim 1, wherein two ends of the case includes at least one through hole which is adapted to be located corresponding to connection ports of the portable electronic device, and having two slide casings which are slidably mounted to the two ends of the case so as to cover up or expose the at least one through hole.

8. The protection case as claimed in claim 7, wherein two sides of the case each have two slide slots and each slide slot comprises a restriction slot and a positioning slot which is smaller than the restriction slot, the positioning slots are located outside of the restriction slots, two inside sides of each of the positioning slots has positioning protrusions, the two slide casings each have two side plates extending beyond the two sides of the case and each side plate has a resilient hook which is slidably engaged with the slide slot corresponding thereto, each resilient hook has a protrusion rod on the side plate and the protrusion rod has an enlarged part on a distal end thereof, the enlarged part has at least one slit defined from the enlarged part to a root portion of the protrusion rod, the protrusion rod is movable in the positioning slot and the enlarged part is movable in the restriction slot, the slit provides a space for deformation of the positioning protrusion.

9. A protection case for a portable electronic device, comprising:
   a resilient coat adapted to be mounted to the portable electronic device and having a through hole which is adapted to be located corresponding to a screen of the portable electronic device, the resilient coat having protrusions which are adapted to be located corresponding to buttons and connection ports of the portable electronic device, the protrusions adapted located corresponding to the connection ports having an insertion hole for receiving a cable inserted therein;
   an outer case having a front part and a rear part which is connected to the front part, the resilient coat clamped between the front and rear parts, the front part having a window which is located corresponding to the through hole of the resilient coat, the front part having a front recess which is located corresponding to the protrusion of the resilient coat, the front part having two front slide slots respectively on two sides thereof, the rear part having a rear recess which is located corresponding to the protrusion of the resilient coat, the front and rear recesses defining an aperture and the protrusion extends through the aperture, the rear part having two rear slide slots respectively on two sides thereof, the front and rear slide slots defining a slide slot, and
   slide having a connection plate and two side plates extending from two sides of the connection plate, the connection plate having an insertion inserted in the insertion hole below the protrusion, the two side plates each have two engaging members which are slidably engaged with the two front and slide slots of the outer case so that the slide is slidable and rotatable relative to the outer case.

10. The protection case as claimed in claim 9, wherein the slide is pivoted an angle and positioned relative to the outer case for angularly supporting the portable electronic device on a surface.

* * * * *